United States Patent
Zhang et al.

(10) Patent No.: US 9,898,968 B2
(45) Date of Patent: Feb. 20, 2018

(54) OLED ARRAY SUBSTRATE WITH SWITCH ARRANGEMENT CONFIGURED TO SWITCH ON DURING LIGHT EMITTING STAGE, DISPLAY PANEL AND DISPLAY DEVICE

(71) Applicant: BOE TECHNOLOGY GROUP CO., LTD., Beijing (CN)

(72) Inventors: Baoxia Zhang, Beijing (CN); Kun Cao, Beijing (CN); Cuili Gai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/105,559

(22) PCT Filed: Oct. 8, 2015

(86) PCT No.: PCT/CN2015/091464
§ 371 (c)(1),
(2) Date: Jun. 16, 2016

(87) PCT Pub. No.: WO2016/184010
PCT Pub. Date: Nov. 24, 2016

(65) Prior Publication Data
US 2017/0124952 A1    May 4, 2017

(30) Foreign Application Priority Data
May 18, 2015   (CN) .......................... 2015 1 0254662

(51) Int. Cl.
*G09G 3/30* (2006.01)
*G09G 3/3258* (2016.01)
(Continued)

(52) U.S. Cl.
CPC ......... *G09G 3/3258* (2013.01); *G09G 3/3266* (2013.01); *H01L 27/3276* (2013.01);
(Continued)

(58) Field of Classification Search
CPC ..... G09G 2300/0426; G09G 2300/043; G09G 2300/0819; G09G 2320/023;
(Continued)

(56) References Cited

U.S. PATENT DOCUMENTS

2004/0095168 A1*  5/2004  Miyazawa ............. G09G 3/325
                                                           327/108
2005/0052367 A1*  3/2005  Miyazawa ........... G09G 3/3241
                                                           345/76

(Continued)

FOREIGN PATENT DOCUMENTS

CN    102208434 A    10/2011
CN    103633100 A     3/2014
(Continued)

OTHER PUBLICATIONS

International Search Report and Written Opinion from PCT Application Serial No. PCT/CN2015/091464, dated Feb. 4, 2016, 12 pages.

(Continued)

*Primary Examiner* — Pegeman Karimi
(74) *Attorney, Agent, or Firm* — Kinney & Lange, P.A.

(57) ABSTRACT

The present disclosure provides an OLED array substrate, and a display panel and a display device including the OLED array substrate. A VDD grid is provided in an existing AMOLED array substrate with a compensation function, VDD lines are connected with the VDD grid via switches, which are applied with corresponding voltages to be switched on during a light emitting stage, such that the VDD lines are electrically connected in parallel to the VDD grid, (Continued)

thus a total resistance of the VDD lines and the VDD grid connected in parallel is decreased relative to the own resistance of the VDD line, so as to reduce the voltage drop on the VDD line in a direction in which the scanning control lines extend, and in turn to decrease a variation in a OLED driving voltage signal effectively, ensuring uniformity of luminance across the display area.

20 Claims, 6 Drawing Sheets

(51) Int. Cl.
*G09G 3/3266* (2016.01)
*H01L 27/32* (2006.01)

(52) U.S. Cl.
CPC ............. *G09G 2300/0426* (2013.01); *G09G 2300/0871* (2013.01)

(58) Field of Classification Search
CPC .............. G09G 3/32–3/3291; G09G 5/00; G09G 3/30; H05B 37/00; H05B 37/02; G06F 3/02; G06F 3/041; G06F 3/045; G06F 3/042; G01R 27/26
See application file for complete search history.

(56) References Cited

U.S. PATENT DOCUMENTS

| | | | |
|---|---|---|---|
| 2006/0244711 A1 | 11/2006 | Kim | |
| 2006/0279499 A1* | 12/2006 | Park | G09G 3/3225 345/92 |
| 2007/0211043 A1* | 9/2007 | Furuichi | G09G 3/3233 345/204 |
| 2008/0231556 A1 | 9/2008 | Kretz et al. | |
| 2010/0073358 A1* | 3/2010 | Ozaki | G09G 3/3233 345/214 |
| 2010/0177086 A1* | 7/2010 | Nakamura | G09G 3/3258 345/211 |
| 2010/0231615 A1* | 9/2010 | Tokuda | G09G 3/3233 345/690 |
| 2011/0128268 A1* | 6/2011 | Kim | G09G 3/3225 345/211 |
| 2012/0062130 A1* | 3/2012 | Ono | G09G 3/3233 315/187 |
| 2012/0236041 A1 | 9/2012 | Oh | |
| 2014/0184579 A1* | 7/2014 | Kim | G09G 3/3208 345/212 |

FOREIGN PATENT DOCUMENTS

| | | |
|---|---|---|
| CN | 103918098 A | 7/2014 |
| CN | 103927968 A | 7/2014 |
| CN | 104299569 A | 1/2015 |
| CN | 104361858 A | 2/2015 |
| CN | 104809988 A | 7/2015 |

OTHER PUBLICATIONS

Chinese Search Report, for Chinese Patent Application No. 201510254662.6, dated Aug. 25, 2015, 8 pages.

* cited by examiner

OLED ARRAY SUBSTRATE WITH SWITCH ARRANGEMENT CONFIGURED TO SWITCH ON DURING LIGHT EMITTING STAGE, DISPLAY PANEL AND DISPLAY DEVICE

BACKGROUND OF THE INVENTION

Field of the Invention

Embodiments of the present application generally relate to the field of display technology, and in particular, to an OLED array substrate, a display panel and a display device.

Description of the Related Art

In an AMOLED (Active-matrix Organic Light Emitting Diode) display system, an illumination luminance of an OLED (Organic Light Emitting Diode) is directly proportional to a driving current applied thereto, and also directly proportional to the square of a driving voltage signal applied thereto. Hereby, in a low-gray scale display condition, the illumination luminance of an AMOLED panel is very sensitive to the variation of the driving voltage signal.

FIG. 1 is a schematic view of an existing arrangement of AMOLED driving voltage signal lines ("VDD" lines for short) with compensation function. As illustrated in FIG. 1, for every one gate line 11, there is provided a VDD line 12 in parallel therewith, which may be positioned above or below corresponding gate line. However, in a direction in which each VDD line extends, there may be a voltage drop which is liable to cause variation in the driving voltage signal of an OLED, which thereby influences the uniformity of display quality across AA (Active Area) of a display screen on the whole panel.

SUMMARY OF THE INVENTION

Embodiments of the present disclosure provide an OLED array substrate, a display panel and a display device, so as to address the technical problem of non-uniform display quality of the panel caused by voltage drop existing on the driving voltage signal line or lines in the prior arts.

According to an aspect of the present disclosure, there is provided an

OLED array substrate, including a plurality of OLED pixel units defined by scanning control lines and data lines, wherein the OLED array substrate further comprises:

N driving voltage signal lines arranged in parallel with corresponding scanning control lines, N being an integer greater than or equal to 1;

a VDD grid electrically insulated from the driving voltage signal lines and laid within a display area, wherein the VDD grid comprises N+1 transverse lines and M longitudinal lines, which are arranged and interconnected in a crisscross pattern to form a plurality of grid areas, where M being an integer greater than or equal to 1, and an orthographic projection of each grid area on the OLED array substrate covers at least one complete OLED pixel unit; and switches arranged outside the display area where the OLED pixel units are located and each provided for one driving voltage signal line for being switched on during a light emitting stage of the OLED pixel unit such that the driving voltage signal line is electrically connected with the VDD grid, wherein each switch has an input terminal connected with a corresponding driving voltage signal line, an output terminal connected with one of the transverse lines adjacent to the corresponding driving voltage signal line, and a control terminal connected to a corresponding control side voltage which is independent of a driving-scanning voltage for the corresponding scanning control line.

Preferably, the driving voltage signal line and the VDD grid are arranged to form an overlapping area where the driving voltage signal line and the VDD grid are located in different layers separated by an insulator and a non-overlapping area where the driving voltage signal line and the VDD grid are located in the same layer.

Preferably, the switches are MOS transistor switches.

Preferably, the MOS transistor switch is an N-type MOS transistor which is switched on when the control side voltage connected to the control terminal of the MOS transistor switch is at a high level and the driving voltage signal line inputs a high level.

Preferably, the MOS transistor switch is a P-type MOS transistor which is switched on when the control side voltage connected to the control terminal of the MOS transistor switch is at a low level and the driving voltage signal line inputs a high level.

Preferably, each of the plurality of the MOS transistor switches arranged outside the display area where the OLED pixel units are located is individually connected to one control side voltage.

Preferably, in the plurality of the MOS transistor switches arranged outside the display area where the OLED pixel units are located, the MOS transistor switches of the same type are together connected to one control side voltage.

Preferably, the plurality of the MOS transistor switches arranged outside the display area where the OLED pixel units are located are of the same type, and random 5, 6, 7 or 8 ones of the plurality of the MOS transistor switches are together connected to one control side voltage.

Preferably, the grid areas of the VDD grid and the OLED pixel units are equal in number.

According to another aspect of the present disclosure, there is provided a display panel comprising the OLED array substrate.

According to a further aspect of the present disclosure, there is provided a display device comprising the display panel.

In embodiments of the present application, the VDD grid is provided in an existing AMOLED array substrate with a compensation function, driving voltage signal lines (VDD lines for short) are connected with the VDD grid via switches, which are applied with corresponding voltages to be switched on during a light emitting stage, such that the VDD lines are electrically connected in parallel to the VDD grid, thus a total resistance of the VDD lines and the VDD grid connected in parallel is decreased relative to the own resistance of the VDD line, so as to reduce the voltage drop on the VDD line in a direction in which the scanning control lines extend, and in turn to decrease a variation in a OLED driving voltage signal effectively, ensuring uniformity of luminance across the display area.

BRIEF DESCRIPTION OF THE DRAWINGS

Figures to be used in the description of embodiments of the present disclosure will be briefly introduced in order to illuminate technique solutions of the embodiments more clearly. Obviously, the following figures only show some of the embodiments of the present disclosure, and other figures may be obtained by those skilled in the art from these figures without any creative work.

DETAILED DESCRIPTION OF PREFERRED EMBODIMENTS OF THE INVENTION

In order to make clearer understanding of objects, features and advantages of the present disclosure, the present disclosure will be described hereinafter in detail with reference to exemplary embodiments and attached drawings. Obviously, the described embodiments are only some, rather than all, of embodiments of the present disclosure. Based on the embodiments of the present disclosure, all of other embodiments obtained by those skilled in the art without any creative work will fall within the scope of the present invention.

In exemplary embodiments of the present disclosure, a VDD grid is provided in an existing AMOLED array substrate with a compensation function, driving voltage signal lines (VDD lines for short) are connected with the VDD grid via switches, which are applied with corresponding voltages to be switched on during a light emitting stage, such that the VDD lines are electrically connected in parallel to the VDD grid, thus a total resistance of the VDD lines and the VDD grid connected in parallel is decreased relative to the own resistance of the VDD line, so as to reduce the voltage drop on the VDD line in a direction in which the scanning control lines extend, and in turn to decrease a variation in a OLED driving voltage signal effectively, ensuring uniformity of luminance across the display area.

Technique solutions of the present disclosure will be described with reference to exemplary embodiments, and the present disclosure includes, but is not limited to, the following embodiments.

Figure 1:
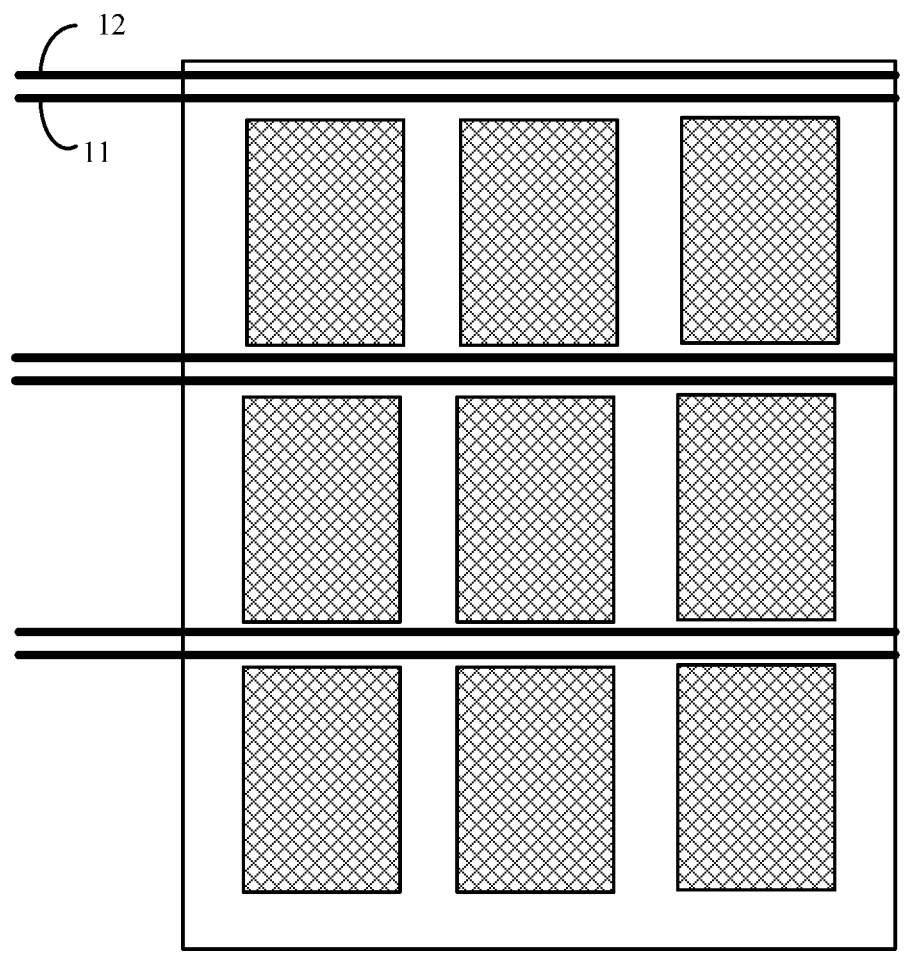
FIG. 1 is a schematic view illustrating an existing arrangement of AMOLED driving voltage signal lines.
Figure 2:
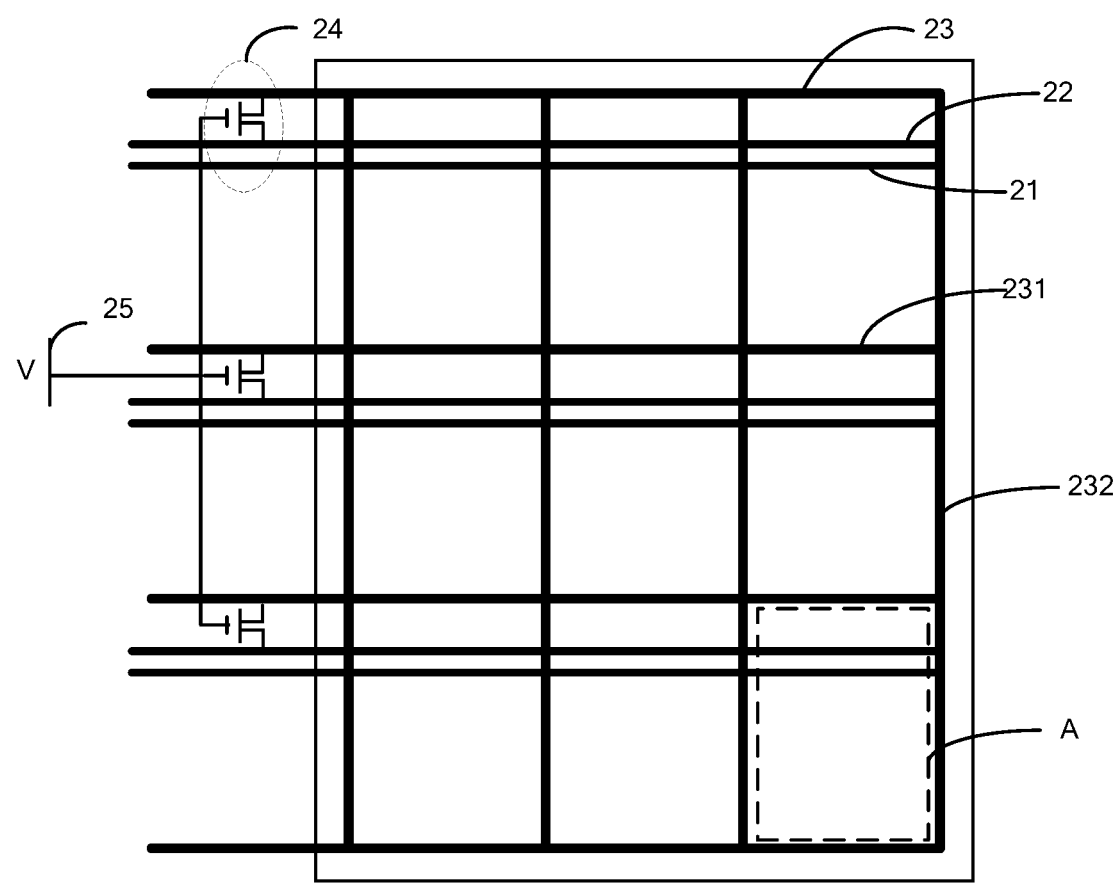
FIG. 2 is a structural schematic view of an OLED array substrate provided according to an exemplary embodiment of the present disclosure.

FIG. 2 is a structural schematic view of an OLED array substrate according to an exemplary embodiment of the present disclosure, the OLED array substrate includes a plurality of OLED pixel units defined by scanning control lines 21 and data lines (not illustrated), and the OLED array substrate further comprises: N driving voltage signal lines 22 arranged in parallel with corresponding scanning control lines 21, N being an integer greater than or equal to 1; a VDD grid 23 electrically insulated from the driving voltage signal (VDD) lines 22 and laid within a display area, wherein the VDD grid 23 comprises N+1 transverse lines 231 and M longitudinal lines 232, which are arranged and interconnected in a crisscross pattern to form a plurality of grid areas A, where M being an integer greater than or equal to 1, and an orthographic projection of each grid area A on the OLED array substrate covers at least one complete OLED pixel unit; and switches 24, such as MOS transistor switches, arranged outside the display area where the OLED pixel units are located and each provided for one VDD line 22 and configured to be switched on during a light emitting period of the OLED pixel unit such that the VDD line 22 is electrically connected with the VDD grid 23, wherein each switch 24 has an input terminal connected with a corresponding VDD line 22, an output terminal connected with one of the transverse lines 231 adjacent to the corresponding VDD line 22, and a control terminal connected to a corresponding control side voltage (V) 25 which is independent of a driving-scanning voltage for the corresponding scanning control line 21.

It should be noted that in the structure of the array substrate shown in FIG. 2, only the structure of some of pixel units are illustrated; in fact, the array substrate may not be only in the form of a 3×3 array, and FIG. 2 is intended only for illustration.

It can be seen from the shown structure of the array substrate that, a VDD grid is provided in an existing AMOLED array substrate with a compensation function, VDD lines are connected with the VDD grid via switches, which are applied with corresponding voltages to be switched on during light emitting period, such that the VDD lines are electrically connected in parallel to the VDD grid, thus a total resistance of the VDD lines and the VDD grid connected in parallel is decreased relative to the own resistance of the VDD line, so as to reduce the voltage drop on the VDD line in a direction in which the scanning control lines extend, and in turn to decrease a variation in a OLED driving voltage signal effectively, ensuring uniformity of luminance across the display area.

Figure 3:
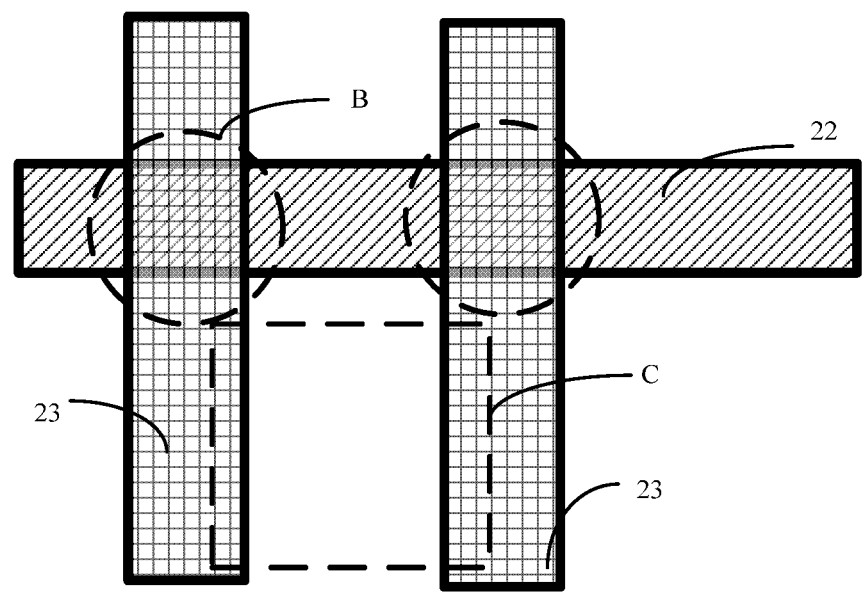
FIG. 3 is a schematic view of overlapping arrangement of VDD lines and a VDD grid, provided according to an exemplary embodiment of the present disclosure.

Preferably, as illustrated in FIG. 3, the VDD line 22 and the VDD grid 23 are arranged to form an overlapping area B where the driving voltage signal line and the VDD grid are located in different layers separated by an insulator and an non-overlapping area C where the VDD line 22 and the VDD grid 23 are located in the same layer.

In fact, there are various arrangements of the VDD lines 22 and the VDD grid 23, and above arrangement is only described as an example.

In an exemplary embodiment of the present disclosure, the VDD grid does not operate at any moment; in fact, it is intended to reduce adverse influence of the voltage drop on the VDD line on the luminance and thus only operates during a light emitting stage of the OLED device. Hereby, it is necessary to arrange a switch for electrically connecting the VDD line and the VDD grid during the light emitting stage.

Figure 4A:
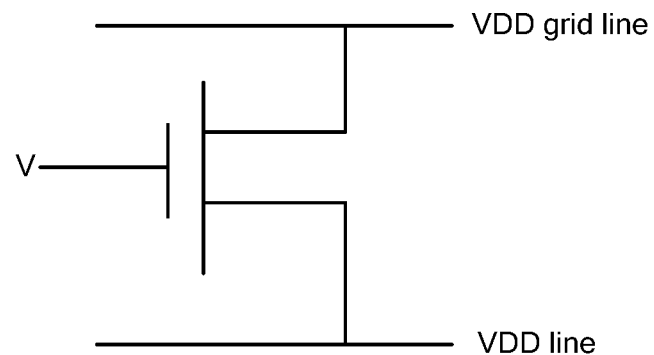
FIG. 4(a)-FIG. 4(b) are structural diagrams and operation timing diagrams of a N-type MOS transistor switch in an exemplary embodiment of the present disclosure.
Figure 4B:
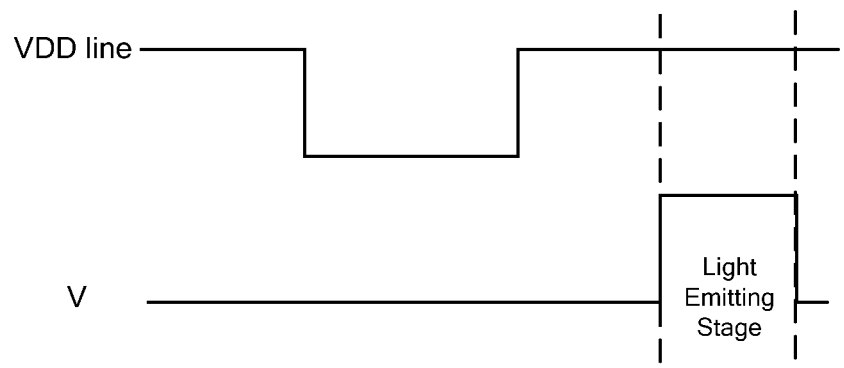

Preferably, as illustrated in FIG. 4(a), the switch 24 is an N-type MOS transistor switch. As can be seen from the operation timing diagram shown in FIG. 4(b), the MOS transistor switch is switched on when the control side voltage V connected to a control terminal of the MOS transistor switch 24 is at a high level and the VDD line inputs a high level (during the light emitting stage).

Figure 5A:
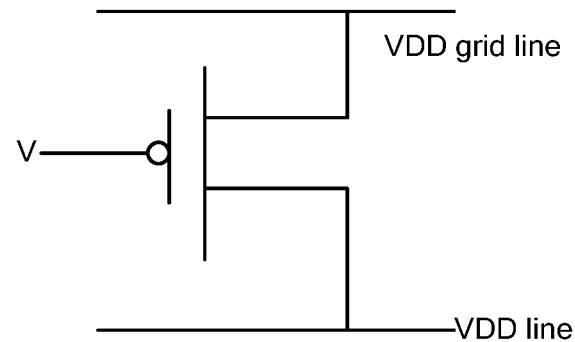
FIG. 5(a)-FIG. 5(b) are structural diagrams and operation timing diagrams of a P-type MOS transistor switch in an exemplary embodiment of the present disclosure.
Figure 5B:
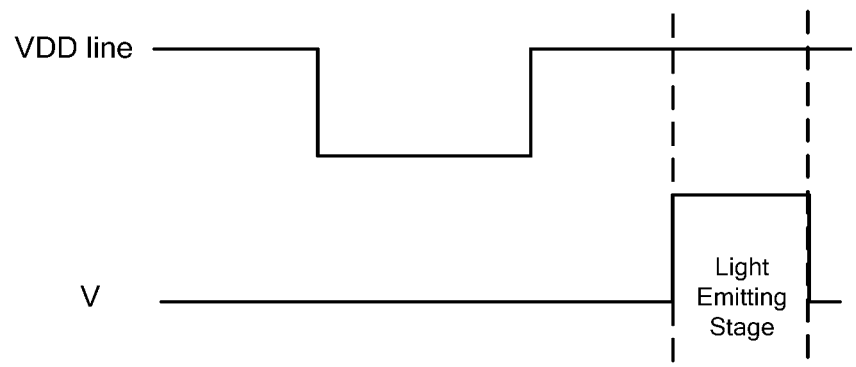

Alternatively, as illustrated in FIG. 5(a), the switch 24 is a P-type MOS transistor switch. As can be seen from the operation timing diagram of FIG. 5(b), the MOS transistor switch is switched on when the control side voltage V connected to the control terminal of the MOS transistor switch 24 is at a low level and the VDD line inputs a high level (during the light emitting stage).

Specifically, the operation processes of the pixel circuit can be divided into four stages, i.e., a resetting stage, a compensation stage, a data-writing stage and a light emitting stage. To be specific, during the resetting stage, electric charges at both sides of a capacitor of the existing pixel circuit are sufficiently discharged so as to accomplish resetting; during the compensation stage, the capacitor of the existing pixel circuit is provided with a threshold voltage;

during the data-writing stage, data signals are written to corresponding nodes; and during the most crucial light emitting stag, voltages across both ends of the OLED device are switched on such that light emitting operation starts. In the present disclosure, the switch is turned off or not switched on and only the VDD lines operate during the resetting, compensation and data-writing stages; and the switch is switched on only during the light emitting stage, such that the VDD line is electrically connected in parallel to the VDD grid, so as to reduce the voltage drop on the VDD line and to alleviate the non-uniformity of luminance.

Preferably, each of the plurality of the MOS transistor switches arranged outside the display area where the OLED pixel units are located is individually connected to one control side voltage, or the MOS transistor switches of the same type are together connected to one control side voltage.

Figure 6:
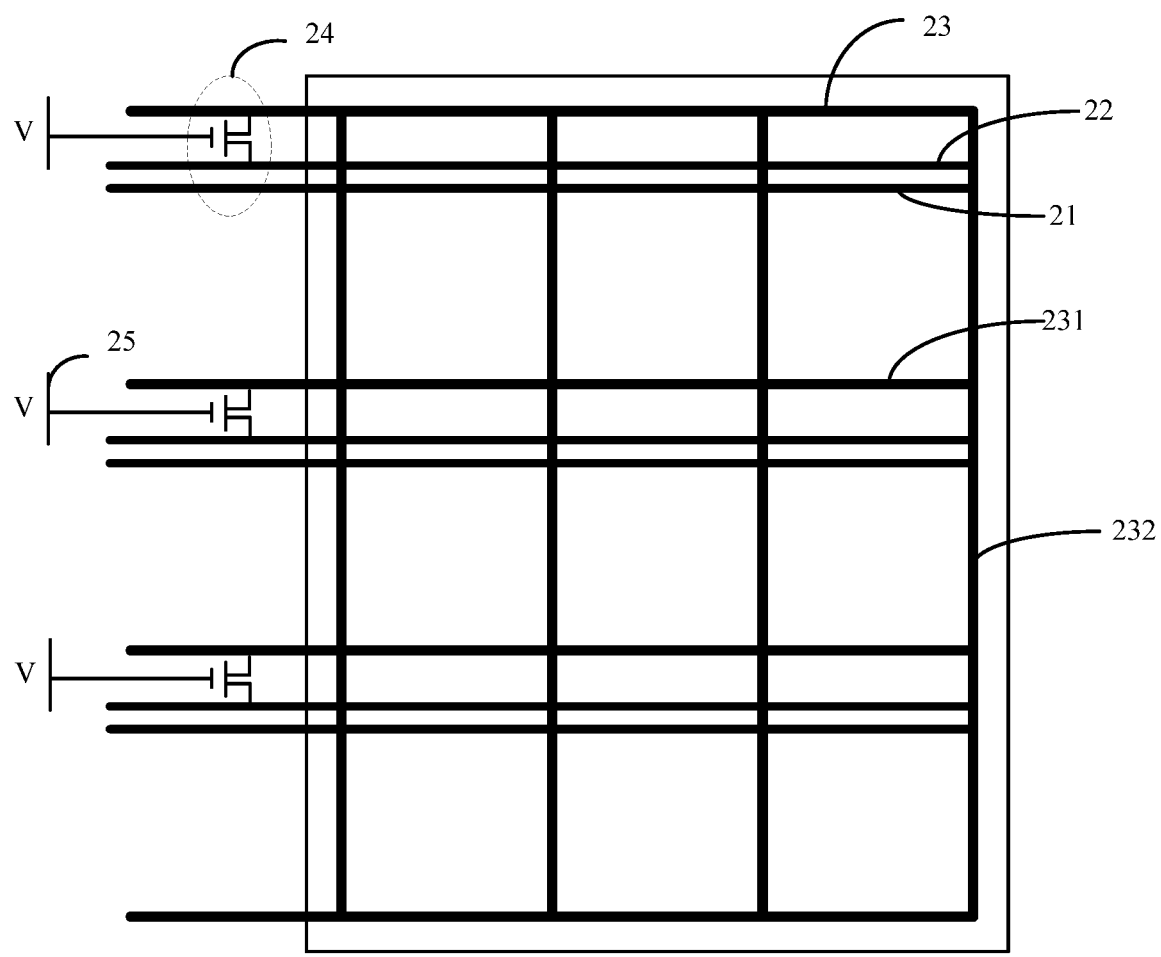
FIG. 6 is a schematic view of a connection between a MOS transistor switch and a control-side voltage in an exemplary embodiment of the present disclosure.

In an exemplary embodiment of the present disclosure, as illustrated in FIG. 6, each of the MOS transistor switches 24 arranged to connect the VDD lines and the VDD grid is individually connected to one control side voltage V Hereby, a targeted controlled compensation can be applied onto each VDD line.

Moreover, as shown in FIG. 2, it is also possible that a plurality of the MOS transistor switches 24 of the same type are together connected to one control side voltage V. Preferably, the plurality of the MOS transistor switches arranged outside the display area where the OLED pixel units are located are of the same type, and for example, random 5, 6, 7 or 8 MOS transistor switches are together connected to one control side voltage.

In an exemplary embodiment of the present disclosure, both N-type and P-type MOS transistor switches may be arranged on the same one array substrate. However, it is necessary to ensure that corresponding control side voltage which is connected to each of the MOS transistor switches varies, or to ensure that control side voltages connected with the MOS transistor switches of the same type are equal to each other. However, considering that the MOS transistor switch is only intended to function to connect the VDD line with the VDD grid, therefore, MOS transistor switches which are of the same one type are preferably provided on the same one array substrate.

Preferably, the grid areas of the VDD grid and the OLED pixel units are equal in number.

Furthermore, in consideration of the compensation effect, the grid areas of the VDD grid and the OLED pixel units are equal in number. As such, corresponding VDD line which is arranged for each pixel row may be compensated for accordingly, so as to reduce voltage drop on the VDD line corresponding to the pixel row and to enhance the compensated fine-granulation.

Based on the same inventive concept as the OLED array substrate provided in the above embodiments of the present disclosure, an embodiment of the present disclosure also provides a display panel, comprising the OLED array substrate as described in any one of aforementioned exemplary embodiments.

Meanwhile, an embodiment of the present disclosure further provides a display device, comprising the display panel. By way of example, the display device may be any product or component which is provided with a display function, such as a mobile phone, a tablet computer, a television set, a display, a laptop computer, a digital photo frame, a navigator, and so on.

Although preferred embodiments of the disclosure have been described, additional modifications and changes may be made to these embodiments once those skilled in the art have understood the basic inventive concept. Accordingly, the attached claims are intended to include the preferred embodiments and all of modifications and changes falling into scope of the present invention.

Obviously, various changes or modifications may be made by those skilled in the art in these embodiments without departing from the principles and spirit of the invention, the scope of which is defined in the claims and their equivalents and which is intended to include these changes and modifications.

What is claimed is:

1. An OLED array substrate, including a plurality of OLED pixel units defined by scanning control lines and data lines, wherein the OLED array substrate further comprises:
   N driving voltage signal lines arranged in parallel with corresponding scanning control lines, N being an integer greater than or equal to 1;
   a VDD grid electrically insulated from the driving voltage signal lines and laid within a display area, wherein the VDD grid comprises N+1 transverse lines and M longitudinal lines, which are arranged and interconnected in a crisscross pattern to form a plurality of grid areas, where M being an integer greater than or equal to 1, and an orthographic projection of each grid area on the OLED array substrate covers at least one complete OLED pixel unit; and
   switches arranged outside the display area where the OLED pixel units are located and each provided for one driving voltage signal line and configured to be switched on only during a light emitting stage of the OLED pixel unit such that the driving voltage signal line is electrically connected in parallel with the VDD grid, wherein each switch has an input terminal connected with a corresponding driving voltage signal line, an output terminal connected with one of the transverse lines adjacent to and parallel to the corresponding driving voltage signal line, and a control terminal connected to a corresponding control side voltage which is independent of a driving-scanning voltage for the corresponding scanning control line.

2. The array substrate according to claim 1, wherein the driving voltage signal line and the VDD grid are arranged to form an overlapping area where the driving voltage signal line and the VDD grid are located in different layers separated by an insulator and an non-overlapping area where the driving voltage signal line and the VDD grid are located in the same layer.

3. The array substrate according to claim 2, wherein the switches are MOS transistor switches.

4. The array substrate according to claim 3, wherein each MOS transistor switch is an N-type MOS transistor which is switched on when the control side voltage connected to the control terminal of the MOS transistor switch is at a high level and the driving voltage signal line inputs a high level.

5. The array substrate according to claim 3, wherein each MOS transistor switch is a P-type MOS transistor which is switched on when the control side voltage connected to the control terminal of the MOS transistor switch is at a low level and the driving voltage signal line inputs a high level.

6. The array substrate according to claim 3, wherein each of the plurality of the MOS transistor switches arranged outside the display area where the OLED pixel units are located is individually connected to one control side voltage.

7. The array substrate according to claim 3, wherein in the plurality of the MOS transistor switches arranged outside the display area where the OLED pixel units are located, the MOS transistor switches of the same type are together connected to one control side voltage.

8. The array substrate according to claim 7, wherein the plurality of the MOS transistor switches arranged outside the display area where the OLED pixel units are located are of the same type, and random 5, 6, 7 or 8 ones of the plurality of the MOS transistor switches are together connected to one control side voltage.

9. The array substrate according to claim 2, wherein the grid areas of the VDD grid and the OLED pixel units are equal in number.

10. A display panel, comprising the array substrate according to claim 9.

11. The array substrate according to claim 1, wherein the switches are MOS transistor switches.

12. The array substrate according to claim 11, wherein each MOS transistor switch is an N-type MOS transistor which is switched on when the control side voltage connected to the control terminal of the MOS transistor switch is at a high level and the driving voltage signal line inputs a high level.

13. The array substrate according to claim 11, wherein each MOS transistor switch is a P-type MOS transistor which is switched on when the control side voltage connected to the control terminal of the MOS transistor switch is at a low level and the driving voltage signal line inputs a high level.

14. The array substrate according to claim 11, wherein each of the plurality of the MOS transistor switches arranged outside the display area where the OLED pixel units are located is individually connected to one control side voltage.

15. The array substrate according to claim 11, wherein in the plurality of the MOS transistor switches arranged outside the display area where the OLED pixel units are located, the MOS transistor switches of the same type are together connected to one control side voltage.

16. The array substrate according to claim 15, wherein the plurality of the MOS transistor switches arranged outside the display area where the OLED pixel units are located are of the same type, and random 5, 6, 7 or 8 ones of the plurality of the MOS transistor switches are together connected to one control side voltage.

17. The array substrate according to claim 1, wherein the grid areas of the VDD grid and the OLED pixel units are equal in number.

18. A display panel, comprising the array substrate according to claim 17.

19. A display panel, comprising the OLED array substrate according to claim 1.

20. A display device, comprising the display panel according to claim 19.

* * * * *